United States Patent
Blaessing et al.

(10) Patent No.: US 6,851,996 B2
(45) Date of Patent: Feb. 8, 2005

(54) METHOD FOR PRODUCING AN ORGANIC ELECTROLUMINESCENT DISPLAY, AND AN ORGANIC ELECTROLUMINESCENT DISPLAY

(75) Inventors: Joerg Blaessing, Erlangen (DE); Georg Wittmann, Herzogenaurach (DE); Jan Birnstock, Leipzig (DE); Karsten Heuser, Erlangen (DE)

(73) Assignee: Osram GmbH (DE)

( * ) Notice: Subject to any disclaimer, the term of this patent is extended or adjusted under 35 U.S.C. 154(b) by 139 days.

(21) Appl. No.: 10/055,142

(22) Filed: Jan. 22, 2002

(65) Prior Publication Data

US 2003/0098946 A1 May 29, 2003

(30) Foreign Application Priority Data

Nov. 27, 2001 (DE) .......................... 101 57 945

(51) Int. Cl.⁷ .......................... H01J 9/00; H05B 33/10
(52) U.S. Cl. .......................... 445/24; 445/25; 349/187; 427/66
(58) Field of Search .......................... 445/24, 25; 427/66; 349/187; 313/504, 506, 500, 505; 428/690, 917

(56) References Cited

U.S. PATENT DOCUMENTS

| | | | | |
|---|---|---|---|---|
| 3,616,098 A | * | 10/1971 | Falls | 428/141 |
| 4,714,323 A | * | 12/1987 | Katagiri et al. | 349/184 |
| 5,270,229 A | | 12/1993 | Ishihara | 437/40 |
| 5,410,217 A | * | 4/1995 | LaPointe | 313/509 |
| 5,427,858 A | * | 6/1995 | Nakamura et al. | 428/421 |
| 5,696,523 A | * | 12/1997 | Yano | 345/60 |
| 5,766,515 A | * | 6/1998 | Jonas et al. | 252/500 |
| 5,804,917 A | * | 9/1998 | Takahashi et al. | 313/504 |
| 6,034,481 A | * | 3/2000 | Haynes | 315/169.3 |
| 6,483,099 B1 | * | 11/2002 | Yu et al. | 250/214.1 |
| 6,582,888 B1 | * | 6/2003 | Herbst et al. | 430/312 |
| 2003/0089252 A1 | * | 5/2003 | Sarnecki | 101/170 |

FOREIGN PATENT DOCUMENTS

| | | | | |
|---|---|---|---|---|
| DE | 26 20 530 C2 | | 5/1982 | .......... 9/35 |
| EP | 0 892 028 A2 | | 1/1999 | .......... H01L/51/20 |
| EP | 0 910 128 A2 | | 4/1999 | .......... C09K/11/06 |
| EP | 986112 A2 | * | 3/2000 | .......... H01L/51/20 |
| WO | WO 99/07189 | | 2/1999 | .......... H05B/33/10 |
| WO | WO 9909603 A1 | * | 2/1999 | .......... H01L/51/00 |
| WO | WO 99/39373 | | 8/1999 | .......... H01L/21/02 |
| WO | WO 99/43031 | | 8/1999 | .......... H01L/51/20 |

* cited by examiner

Primary Examiner—Mariceli Santiago
(74) Attorney, Agent, or Firm—Fish & Richardson P.C.

(57) ABSTRACT

A method for producing a display, in which a first electrode film is produced on a substrate, functional layers are then applied to this film, and a second electrode film is then produced on the functional layer. The first and/or second electrode film according to the invention is produced overall or structured on the substrate by means of a contact printing process.

10 Claims, 4 Drawing Sheets

METHOD FOR PRODUCING AN ORGANIC ELECTROLUMINESCENT DISPLAY, AND AN ORGANIC ELECTROLUMINESCENT DISPLAY

BACKGROUND OF THE INVENTION

So-called liquid crystal displays (LC displays) are largely dominant today on the flat video screen market. LC displays are distinguished by low-cost production, low electrical power consumption, low weight, and small space requirement. In addition, or course, LC displays also have drawbacks, which consist foremost of the fact that these video screens are not self-illuminating and therefore can be read or recognized only under suitable ambient light conditions.

Displays based on organic light-emitting diodes, OLEDs (Organic Light Emitting Diodes), have acquired a name for themselves since 1987. They consist in principle of electroluminescent organic films that are positioned between two electrodes. When an electrical potential is applied to the electrodes, light is emitted because of the recombinations between electrons and "holes", which are injected into the organic films. Because of the self-emissivity of OLEDs, with them there is no need for the backlighting that is often necessary with LC displays. The space requirement and electrical power consumption of OLEDs is thereby reduced considerably. Switching times are in the range of one microsecond and are only slightly temperature-dependent, which makes possible their use for video applications. The reading angle is nearly 180°. Polarizing films such as those necessary with LC displays are usually not needed, so that greater brightness of the display elements can be produced. Another advantage is the ability to use flexible and non-planar substrates.

A transparent electrode (anode) of indium-tin oxide (ITO) is used for OLEDs in most cases. ITO is usually applied to the whole surface of a substrate, which is generally transparent, and is then structured by a photolithographic process followed by etching with HBr, which produces the desired form of the electrodes. Electrodes are structured in the form of parallel electrode strips as a rule for use as a passive matrix display.

For special applications, for example for full-color displays, additional layers such as color filters can be located between the substrate and the ITO electrode strips. The functional organic films are then applied to the structured anode. In case of films that consist of low molecular weight systems, for example hydroxyquinoline-aluminum(III) salts, this is usually done by a thermal vaporization process under vacuum. When electroluminescent polymers are used, the functional films can be applied by overall coating processes from solution, for example by blade coating, spin coating, or special printing methods, for example screen printing or ink jet printing. The publication EP 0 892 028 A 2 discloses how to apply functional polymers in the windows of a window layer that define the image points, by means of a contactless ink jet printing process. Multilayered functional films can also be made by this contactless printing process. The publication WO 99/07189 discloses a number of standard printing processes, for example web printing, offset printing, and screen printing processes, for applying electroluminescent polymers.

The second electrode, the cathode, can then typically be applied to the organic electroluminescent films by vapor deposition through a shadow mask. The size, shape, and separation of the cathode structures that can be produced are limited by the ability to manipulate these masks. To circumvent this problem for various applications, for example passive matrix displays, parallel rows of strip-shaped ridges with breakaway edges are constructed of photoresist on the first electrode strips, as disclosed, for example, in the publication EP 0 910 128 A2. Parallel cathode paths with defined width and spacing can be produced perpendicular to the anode strips by the shape and positions of these strip-shaped ridges, by vapor deposition of an overall metal coating and then removing it at the breakaway edges of the strip-shaped ridges, so that the cathode strips are produced. This method has the drawback that an additional process step is necessary, namely the structuring of the strip-shaped ridges.

It is known from the publications WO 99/39373 and WO 99/43031 how to produce the electrodes by a contactless ink jet printing process. However, this process is very slow and therefore very cost-intensive. Furthermore, it is very difficult to produce homogeneous electrode films with a definite thickness by the ink jet printing process.

SUMMARY OF THE INVENTION

In the first process step A) of the production method according to the invention, a first electrode film is produced on a substrate. At least one functional organic film is produced on the first electrode film in a process step B). In a process step C), a second electrode film is produced on the functional film, with at least one of the electrode films or both electrode films being produced on the substrate by means of an overall contact printing process.

The method according to the invention has the advantage that the electrode films can be produced in a single process step by the contact printing process. Thus, time-consuming and costly high vacuum steps in which the electrode films have to be vapor-deposited are no longer necessary. Furthermore, it is possible by the contact printing process to imprint large areas on the substrate with the electrode films in a short time.

Contact printing processes here mean all overall printing processes in which the part of a printer that is responsible for transferring the electrode films, for example a press roller or a screen, is in contact with the surface to be imprinted. When the first electrode film is printed, this part of the printer is in contact with the substrate. On the other hand, when the second electrode film is printed, the printer contacts the electroluminescent films. A large number of printing processes are practical, with the exception of contactless ink jet printing. Flexo printing may be mentioned, in which flexible printing plates, for example made of rubber or a plastic, can be used. Penetrating printing processes, for example the screen printing process or stencil printing, in which the printing is done through a printing template that consists of a template made of a material permeable to ink, can be used. Tampon printing and thermotransfer printing, in which electrical signals are converted to heat, which in turn produces a structure to be printed on a recording material, are also possible. Planographic printing, as well as letterpress and gravure printing methods are also practical. In the case of planographic printing, for example offset printing, a printing plate such as a roller, whose printing and non-printing areas lie in practically the same plane, does the printing. In gravure or letterpress printing a printing plate whose printing areas are either recessed or raised relative to the rest of the cylinder does the printing.

The first and second electrode films can be applied structured in the form of electrode strips that run perpendicular to one another by the process according to the invention, so that electrodes suitable for passive matrix displays can also be printed. The advantage of this variant of the method according to the invention consists of the fact that the electrode strips can be produced and structured especially advantageously in one process step by the mentioned contact printing processes, and that no separate structuring is any longer necessary. Furthermore, no costly vapor deposition steps through shadow masks are any longer needed.

The functional films can comprise a liquid crystal matrix or organic electroluminescent materials, since the method according to the invention can be used both to produce liquid crystal displays and to produce organic light-emitting diodes with a single luminous surface and OLED displays with a matrix of image points.

A number of metal pastes, metal oxide pastes, or electrically conductive polymers can be used in the method according to the invention as printable materials. For example, paste solders with tin, lead, or silver that contain fluxes, for example higher alcohols such as glycol ethers to adapt the viscosity, can be used as metal pastes. Other constituents, for example resins, can likewise affect printability. Practical metal oxide pastes, for example, are pastes based on indium-tin oxide. It is also possible to use not only tin-doped indium oxide, but also zinc-doped indium oxide (IZO). Examples of electrically conductive polymers that can be used are polyaniline (PANI), polyethylenedioxythiophene (PEDOT), or mixtures of PEDOT and polystyrenesulfonic acid (PSS). As a rule, a liquid or viscous phase that contains these electrically conductive polymers and any organic solvents, for example methylbenzenes such as xylene or toluene, is used as a printable material, with the solvent being vaporized after printing.

Another variant of the method according to the invention consists of producing only the first electrode film or the first electrode strips in process step A) by means of a contact printing process. The second electrically conductive film or the second electrode strips are then vapor-deposited in process step C) through a shadow mask. This variant has the advantage that no other electrode film is printed on the mechanically sensitive electroluminescent films, but this is vapor-deposited especially gently.

In another variant of the method according to the invention, prior to process step C) and/or B), spacers are produced in a separate process step B1). The spacers are applied so that the component of the printer responsible for transferring the second electrode film to the electroluminescent films in process step C) can contact only the spacers but not the readily damaged electroluminescent films already applied. It is possible in this case for the spacers to be produced on the substrate and on the first electrode film prior to the application of the functional films, or after process step B) directly on the functional films. The spacers are advantageously structured so that their maximum spacing is smaller than the smallest horizontal dimension of the part of the printer responsible for transferring the electrode material. This procedure, for example, prevents a print cylinder from falling between any peg-shaped spacers and thereby being pressed into the functional film already applied and damaging it. The spacers can be structured, for example, in the form of pegs or strip-shaped ridges.

The spacers can be printed by a number of standard printing methods, or they can be structured from a positive or negative photoresist. In this case the photoresist is applied overall and is then exposed through a mask and then developed.

In addition, in another refinement of the method according to the invention, the functional film can be produced in process step B) by a printing process. The aforementioned contact printing processes are practical, but also contactless printing processes, for example such as ink jet printing. Above all, the contact printing processes have the advantage that large areas can be imprinted especially easily and economically with the functional films in a short time. It is also possible for the functional films to be centrifuged on, for example by spin coating.

In another advantageous refinement of the method according to the invention, the first electrode strips are produced on the substrate in process step A) by means of the contact printing processes. In a separate process step B2), prior to process steps B) and/or C), strip-shaped ridges are then structured with overhanging edge shapes that run perpendicular to the first electrode strips. An overall metal layer can then be applied to the display in process step C, for example by vacuum deposition, with this metal layer breaking off at the overhanging edge shapes of the ridges so that the second electrode strips are formed.

If the second electrode strips are applied and structured by the strip-shaped ridges with the overhanging edges or by vapor deposition through a shadow mask, then metal can be used as the material for the electrode strips. All non-noble metals, for example calcium, barium, or magnesium are practical. These metals have the advantage that they have a relatively low electron affinity of about 3 electron volts, which particularly effectively makes it possible to inject charges into the electroluminescent polymers.

It is also possible to use a transparent substrate, for example glass or plastic, and then to print on it in process step A) a transparent electrically conductive first electrode film or electrode strips. In this case the light produced by electroluminescence is emitted through the transparent first electrode and the transparent substrate. Indium-tin oxide pastes, as well as the electrically conductive polymers such as PEDOT, are then eminently practical as materials for these electrodes.

When the spacers already mentioned are attached, these regions no longer light up since the electroluminescent films can have no contact with the two electrodes here. For this reason it is advantageous for full-area light-emitting diodes that have do not have a matrix of image points but rather a single continuous diode, in the case of light emission through a transparent substrate and a transparent first electrode placed on the substrate, to dull the substrate on the face toward the viewer, at least in some areas. The dulling is produced by microscopically small depressions in the surface. Each such depression acts as a scattering center for the emitted light. The thin spacers can be made quasi "invisible" to the viewer of the final display by the diffuse distribution of the light and the homogenization of light emission associated with it. If glass panes are used as the transparent substrate, for example, they can be roughened by sand blasting and thereby dulled. The dulling can be performed at any time during the process according to the invention.

Other advantages and features of the invention will be apparent from the following description of a particular embodiment thereof and from the claims.

DETAILED DESCRIPTION OF A PARTICULAR EMBODIMENT

Figure 1:
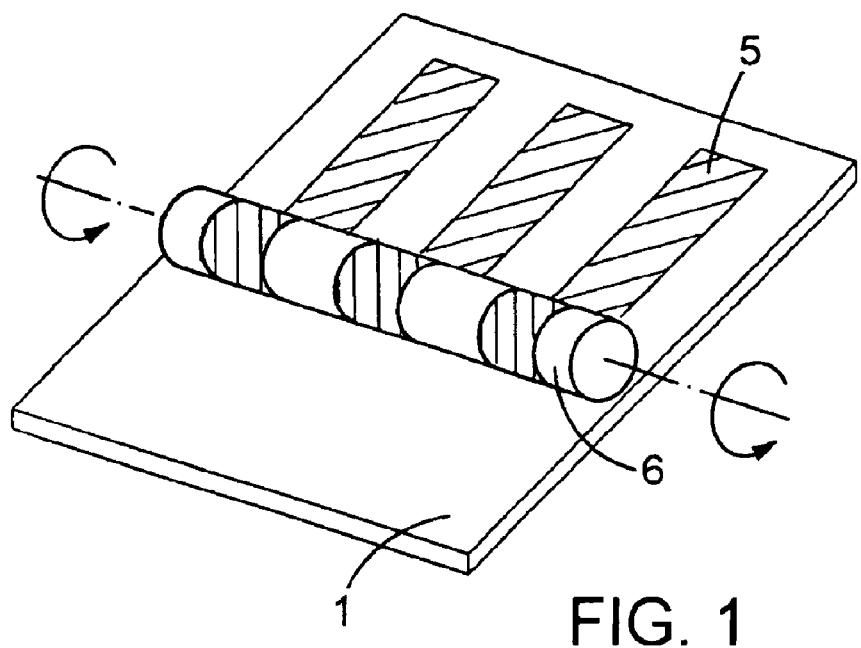
FIGS. 1–7 show schematically various process steps of an especially advantageous variant of the process according to the invention.

FIG. 1 shows how first electrode strips 5 structured by a roller 6 are applied to a substrate 1 (process step A). The printing areas of the press cylinder 6, for example, can be raised (letterpress printing process).

Figure 2:
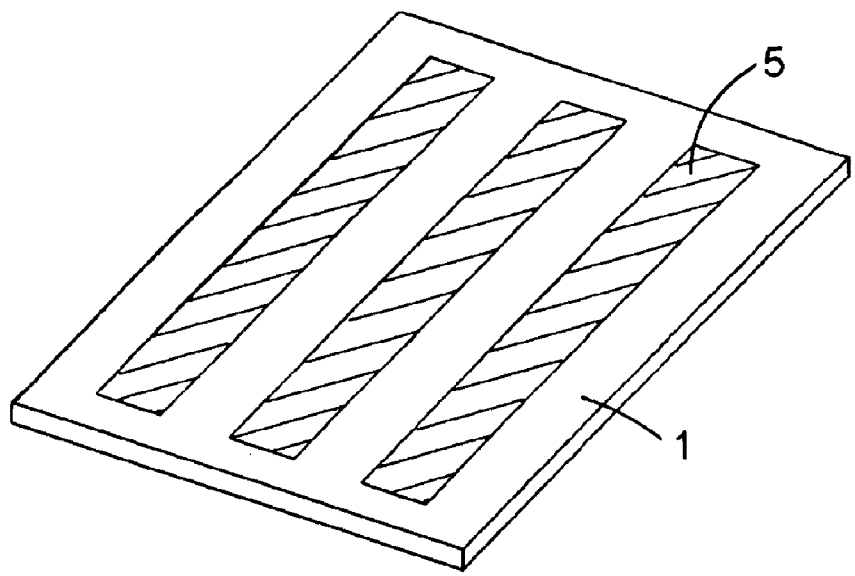

FIG. 2 shows the substrate 1 with the first electrode strips 5 after process step A).

Figure 3:
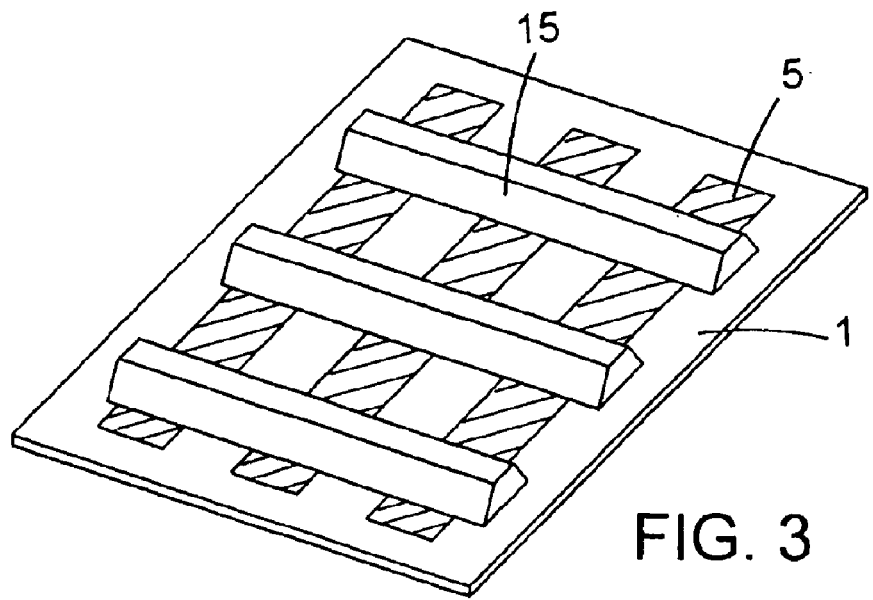

FIG. 3 shows the additional process step B1), in which spacers 15 are applied perpendicular to the first electrode strips 5. As mentioned above, these spacers can be either imprinted or can be structured from a positive or negative photoresist by exposure, for example through a mask. The spacers 15 are advantageously structured so that their areas farthest from the substrate 1 have a tapered smaller cross section, i.e. they have no overhanging edge shape. This has the advantage that it is possible in this way to vapor-deposit the second electrode strips overall through a shadow mask, without breaking them off at the spacers. In the variant of the of the process according to the invention shown here, in which the second electrode strips are printed between these spacers, it is not necessarily important for the spacers to have no overhanging structures.

Figure 4:
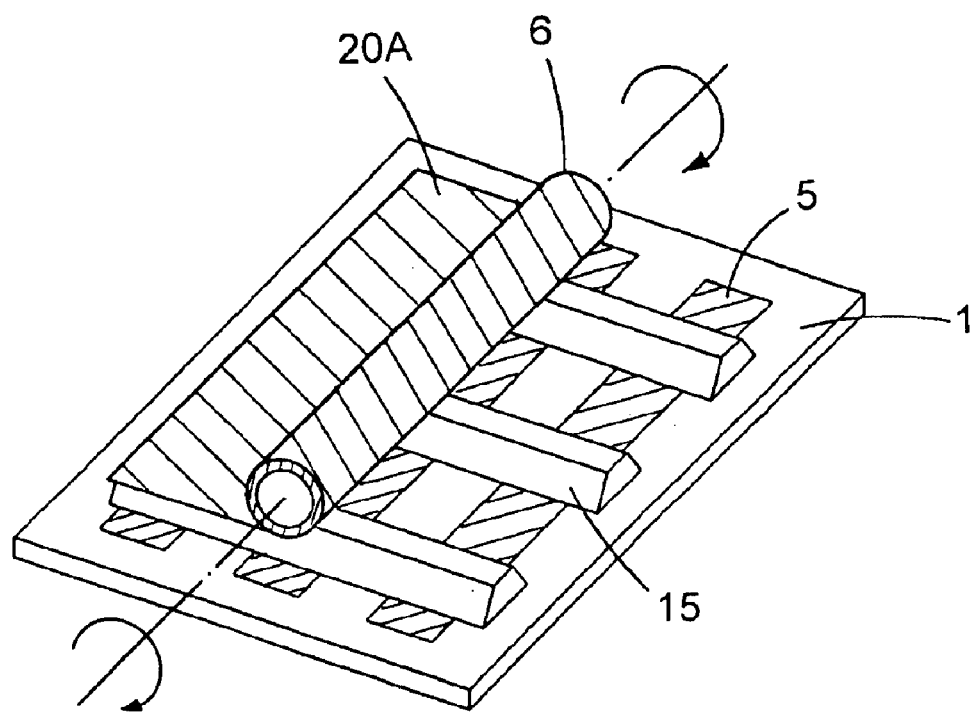

FIG. 4 shows process step B). The material with a solvent for the printable electroluminescent films 20A is printed overall on the substrate by means of the roller 6. Since the film thickness of the functional layer immediately after application, e.g. 5 µm, is usually greater than the maximum height of the spacers, which may be 2 µm, the elevations of the spacers are completely covered by the functional layer, which has not yet dried, so that a planar surface is formed on the substrate.

Figure 5:
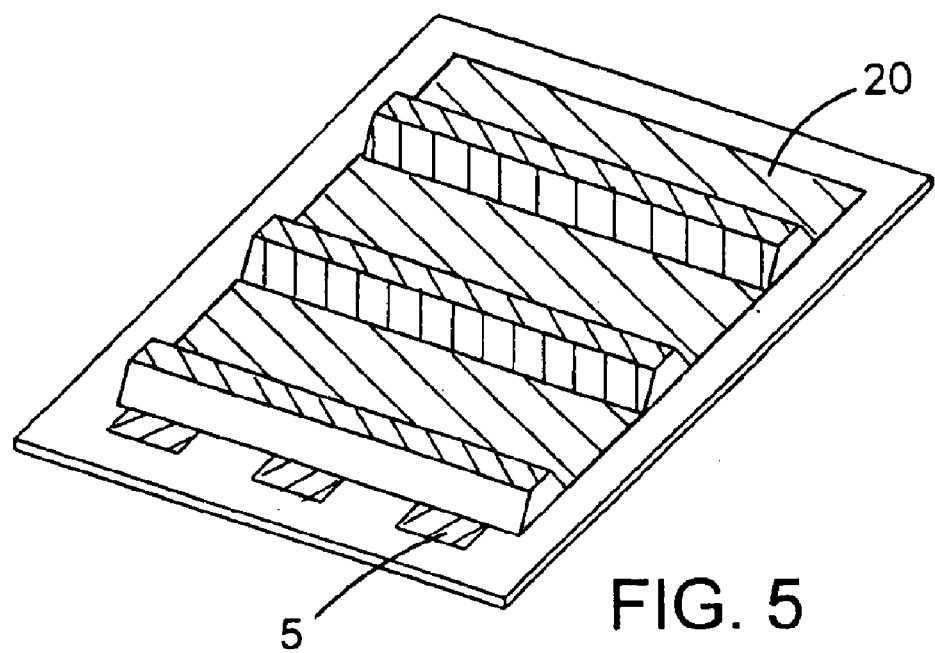

FIG. 5 shows the system with the functional layer 20, for example with an electroluminescent layer after drying. Since the printable functional films contain a very high proportion of solvent (up to 99%), these films shrink considerably during the drying process because of the evaporation of solvent. Thus, the film thickness of the electroluminescent film is reduced during drying, for example from 5 µm to perhaps 75 nm. This guarantees that the spacers have a greater height than the functional film already applied, and can thus perform their function during the application of the second electrode strips in process step C).

Figure 6:
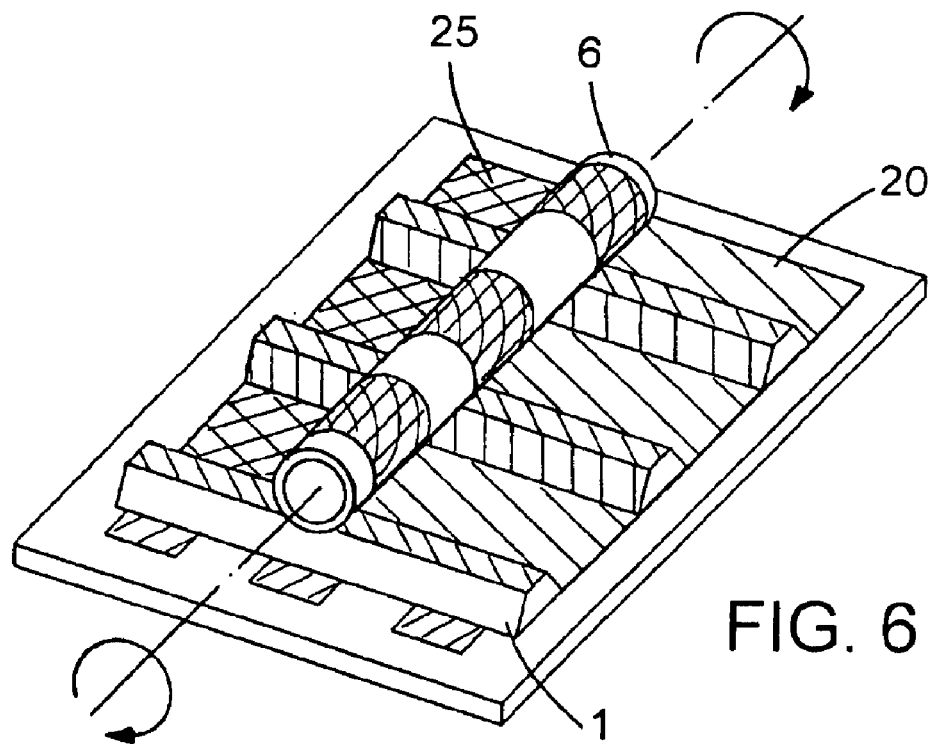

FIG. 6 shows process step C) in which the second electrode strips 25 are printed by the roller 6 with structuring perpendicular to the first electrode strips 1 between the spacers 15. The spacers 15 prevent the roller 6 from coming into direct contact with the electroluminescent layers 20 and damaging them. However, since the thickness of the second electrode strips to be transferred on the roller 6 is greater than the height of the spacers 15, now as before the electrode material is transferred to the electroluminescent layers 20.

Figure 7:
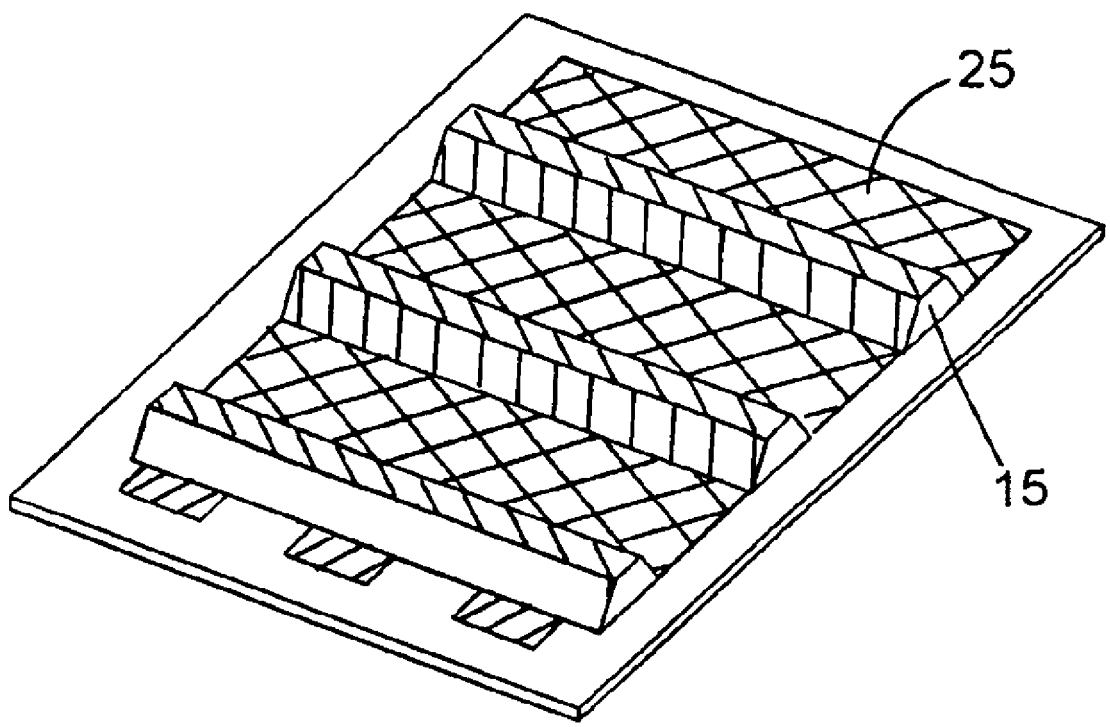

FIG. 7 shows the OLED display after process step C). The second electrode strips 25 are located between the spacers 15.

EXAMPLE OF EMBODIMENT 1

Passive Matrix Display

Polyaniline is printed on a transparent substrate by screen printing so that parallel first electrode strips with a width of 300 µm and a spacing of 30 µm and a height of 1 µm are formed. Two layers of functional electroluminescent polymers are then spin-coated or printed on the first electrode strips. Finally, second parallel electrode strips of a metal of low electron affinity, for example zinc, are printed perpendicular to the first electrode strips, with a width of 300 µm and a spacing of 30 µm. A zinc paste is used as the printable material. The crossing points of the first and second electrode strips define the luminous pixels (pixel area about 300×300 $\mu m^2$).

EXAMPLE OF EMBODIMENT 2

Full-Color Display with Color Filters.

Structured color filters are applied to a transparent substrate. Three differently colored color filters, red, green, and blue are arranged so that they define 3 subpixels for one color pixel. Each three subpixels constitute one image point whose color is composed additively of the colors of the subpixels, so that any composite color that can be displayed can be produced. A mixture of PEDOT and PSS can be printed by tampon printing on the color filters so that parallel first electrode strips are formed with a width of 70 µm and a spacing of 30 µm. Conventional structuring of the first electrode strips, for example with reactive chemicals such as hydrogen bromide (HBr), which would damage the color filters, can be avoided according to the invention to particular advantage by the structured imprinting of the first electrode strips.

Several layers of small electroluminescent molecules, for example aluminum-hydroxyquinoline(III) salts, are deposited by vacuum vapor deposition on the first electrode strips A thin layer of lithium fluoride about 1 nm thick is then vapor-deposited.

Parallel second electrode strips perpendicular to the first electrode strips of conductive silver paste are then printed by screen printing, with a width of 270 µm and a spacing of 30 µm, as the cathode. The crossing points of the first electrode strips, the anode, and the second electrode strips, the cathode, define the full-color luminous pixels of the display (area about 270×270 $\mu m^2$, subpixels each 70×270 $\mu m^2$). The interlayer of lithium fluoride in combination with a cathode material with low electron affinity, for example aluminum or silver, shows very good electron injection properties of the electroluminescent polymers. The lithium fluoride interlayer is so thin that it can be vacuum-deposited without affecting the properties of the structured printed cathode.

The process according to the invention is not limited to the examples of embodiment described here explicitly. Thus it is possible, for example, to apply only one of the electrode films or electrode strips by contact printing processes, and to use different printing processes or other processes mentioned above for the other electrode strips. It is also possible to print other printable electrically conductive materials by the process according to the invention.

List of Reference Symbols

1 Substrate
5 First electrode strips
6 Press roller
15 Spacer
20A Printable electroluminescent layer
20 Electroluminescent layer after drying
25 Second electrode strips

What is claimed is:

1. Method for producing a display with the following process steps:

A) a first electrode film is produced on a substrate,

B) at least one functional layer is produced on the first electrode film,

C) a second electrode film is produced on the functional layer, the first and/or second electrode film being produced overall on the substrate by means of a contact printing process, in which spacers are produced in a process step B1) prior to process step C) and/or B), and in which the spacers in process step C) prevent contact between the functional layer and a component of a printer responsible for transferring the second electrode film.

2. The method according to claim 1 in which the first and second electrode films are applied structured in the form of electrode strips and perpendicular to one another.

3. The method according to claim 1 in which organic electroluminescent materials are applied as the functional layer in process step B).

4. The method according to claim 1 in which the spacers (15) are structured as strip-shaped ridges in process step B1).

5. The method according to claim 1, in which the face of the substrate (1) facing the observer is dulled in at least some areas.

6. The method according to claim 1, wherein the spacers are structured as strip-shaped ridges in process step B1).

7. The method according to claim 1, in which organic electroluminescent materials are applied as the functional layer in process step B).

8. Method for producing an OLED display with the following process steps:
   A) a first electrode film is produced on a substrate,
   B) at least one functional layer comprising organic electroluminescent materials is produced on the first electrode film,
   C) a second electrode film is produced on the functional layer,
   the first and second electrode film being produced by means of a contact printing process in the form of electrode strips running perpendicular to each other,
   in which first electrode strips are produced on the substrate in process step A) by a contact printing process, and in which strip-shaped ridges with overhanging edge forms that run perpendicular to the first electrode strips are structured in a process step B2) prior to process steps B) and/or C), and in which a metal layer is applied overall in process step C), which is structured by the strip-shaped ridges as second electrode strips.

9. Method for producing a liquid crystal display including the following process steps:
   A) a first electrode film is produced on a substrate,
   B) at least one functional layer is produced on the first electrode film,
   C) a second electrode film is produced on the functional layer,
   the first and/or second electrode film being produced overall on the substrate by means of a contact printing process, in which spacers are produced in a process step B1) prior to process step C) and/or B), and in which the spacers in process step C) prevent contact between the functional layer and a component of a printer responsible for transferring the second electrode film.

10. Method for producing an OLED display with the following process steps:
   A) a first electrode film is produced on a substrate,
   B) at least one functional layer comprising organic electroluminescent materials is produced on the first electrode film,
   C) a second electrode film is produced on the functional layer,
   the first and second electrode film being produced by means of a contact printing process in the form of electrode strips running perpendicular to each other,
   in which a transparent substrate is used, and in which a transparent, electrically conductive first electrode film or electrode strips is/are produced.
   in which the face of the substrate (1) facing the observer is dulled in at least some areas.

* * * * *

UNITED STATES PATENT AND TRADEMARK OFFICE
CERTIFICATE OF CORRECTION

| | | |
|---|---|---|
| PATENT NO. | : 6,851,996 B2 | |
| APPLICATION NO. | : 10/055142 | |
| DATED | : February 8, 2005 | |
| INVENTOR(S) | : Joerg Blaessing et al. | |

It is certified that error appears in the above-identified patent and that said Letters Patent is hereby corrected as shown below:

Title page,
Item [75], Inventors, replace "Joerg Blaessing, Erlangen (DE)" with -- Joerg Blaessing, Oberkochen (DE) --.

Column 7,
Line 11, after "claim 1" insert -- , --.

Signed and Sealed this

Twenty-seventh Day of June, 2006

JON W. DUDAS
*Director of the United States Patent and Trademark Office*